US008884664B1

(12) United States Patent  
Bradley

(10) Patent No.: US 8,884,664 B1  
(45) Date of Patent: Nov. 11, 2014

(54) SYSTEMS AND METHODS FOR GENERATING LOW BAND FREQUENCY SINE WAVES

(71) Applicant: Anritsu Company, Morgan Hill, CA (US)

(72) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 13/841,718

(22) Filed: Mar. 15, 2013

(51) Int. Cl.
*H03K 21/00* (2006.01)
*H03K 23/00* (2006.01)
*H03K 25/00* (2006.01)
*H03B 19/00* (2006.01)
*H03M 1/80* (2006.01)

(52) U.S. Cl.
CPC ............. *H03B 19/00* (2013.01); *H03M 1/808* (2013.01)
USPC ........... 327/115; 327/117; 327/118; 327/116; 327/119

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | | | | |
|---|---|---|---|---|---|
| 4,897,620 | A | * | 1/1990 | Paradise | 332/100 |
| 4,905,177 | A | * | 2/1990 | Weaver et al. | 708/276 |
| 4,998,276 | A | * | 3/1991 | Hasegawa | 379/361 |
| 5,216,389 | A | * | 6/1993 | Carralero et al. | 331/18 |
| 5,398,031 | A | * | 3/1995 | Saji | 341/173 |
| 5,513,219 | A | * | 4/1996 | Ham | 375/272 |
| 6,005,419 | A | * | 12/1999 | Rudish | 327/107 |
| 6,292,123 | B1 | * | 9/2001 | Bowers et al. | 341/144 |
| 6,400,821 | B1 | * | 6/2002 | Burgan et al. | 379/361 |
| 6,522,176 | B1 | * | 2/2003 | Davis | 327/105 |
| 6,867,625 | B1 | * | 3/2005 | Stoyanov | 327/105 |
| 7,437,391 | B2 | * | 10/2008 | Miller | 708/276 |

* cited by examiner

*Primary Examiner* — Brandon S Cole
(74) *Attorney, Agent, or Firm* — Meyer IP Law Group

(57) ABSTRACT

An embodiment of a system for generating a low phase noise sine wave includes a variable signal source for generating a signal a series of octave dividing stages connected with the variable signal source, an input divider connected with the variable signal source, and a second series of octave dividing stages connected with an output of the pre-input frequency divider. Each octave dividing stage generating a successive octave of the generated signal using a frequency divider, a sine look up table, and a low pass filter.

18 Claims, 6 Drawing Sheets

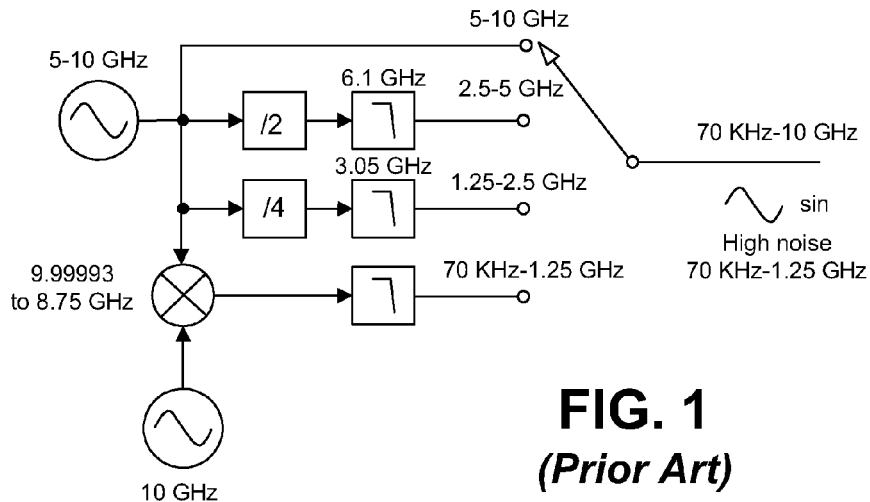
FIG. 1
*(Prior Art)*
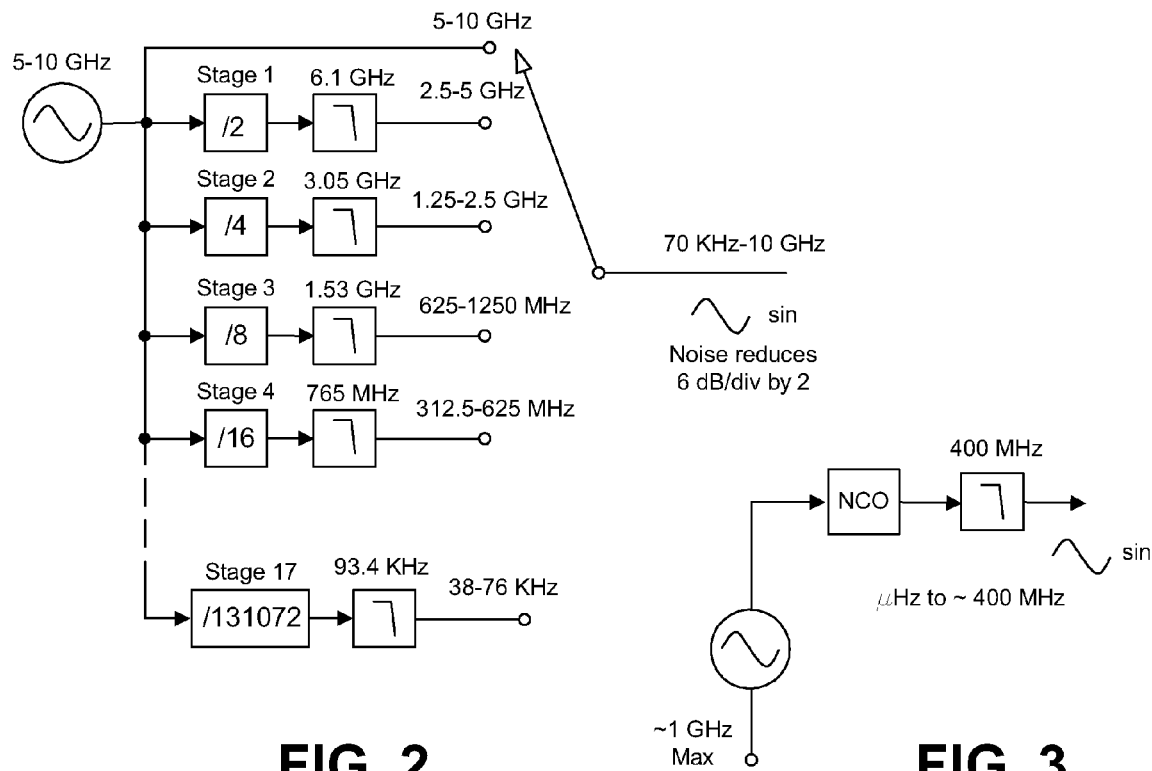
FIG. 2
*(Prior Art)*
FIG. 3
*(Prior Art)*

SYSTEMS AND METHODS FOR GENERATING LOW BAND FREQUENCY SINE WAVES

TECHNICAL FIELD

The present invention relates to systems and methods for generating low band frequency sine waves.

BACKGROUND

Signal generators are electronic devices that generate repeating or non-repeating electronic signals in either the analog or digital domains. Signal generators are also known variously as function generators, radio frequency (RF) and microwave signal generators, pitch generators, arbitrary waveform generators, digital pattern generators and frequency generators. They are generally used in designing, testing, troubleshooting, and repairing electronic or electroacoustic devices.

There are many different types of signal generators, with different purposes and applications (and at varying levels of expense). RF and microwave signal generators are used for testing components, receivers, and test systems in a wide variety of applications including cellular communications, WiFi, WiMAX, GPS, audio and video broadcasting, satellite communications, radar and electronic warfare. RF and microwave signal generators normally have similar features and capabilities, but are differentiated by frequency range. RF signal generators typically range from a few kilohertz to 6 GHz, while microwave signal generators cover a much wider frequency range, from less than 1 MHz to at least 20 GHz. Some models operate at frequencies as high as 70 GHz with a direct coaxial output, and up to hundreds of gigahertz when used with external waveguide source modules. RF and microwave signal generators can be classified further as analog or vector signal generators.

It can be advantageous for RF and microwave signal generators used in measurement instruments for testing components at cellular sites to be broadband, portable and relatively low power. However, generating low band frequencies from high frequency oscillators can be difficult, expensive, and power hungry, and can result in signals too noisy for use in sensitive applications. Instruments including, but not limited to, vector network analyzers (VNAs) can benefit from improved systems and methods for generating low band frequency sine waves.

BRIEF DESCRIPTION OF THE DRAWINGS

FIG. 1 is a block diagram of a prior art method of generating low band frequency sine waves by mixing signals from two oscillators.

FIG. 2 is a block diagram of a prior art method of generating low band frequency sine waves by dividing a signal from a single oscillator.

FIG. 3 is a block diagram of a prior art method of generating low band frequency sine waves using a numerically controlled oscillator.

DETAILED DESCRIPTION

Figure 4:
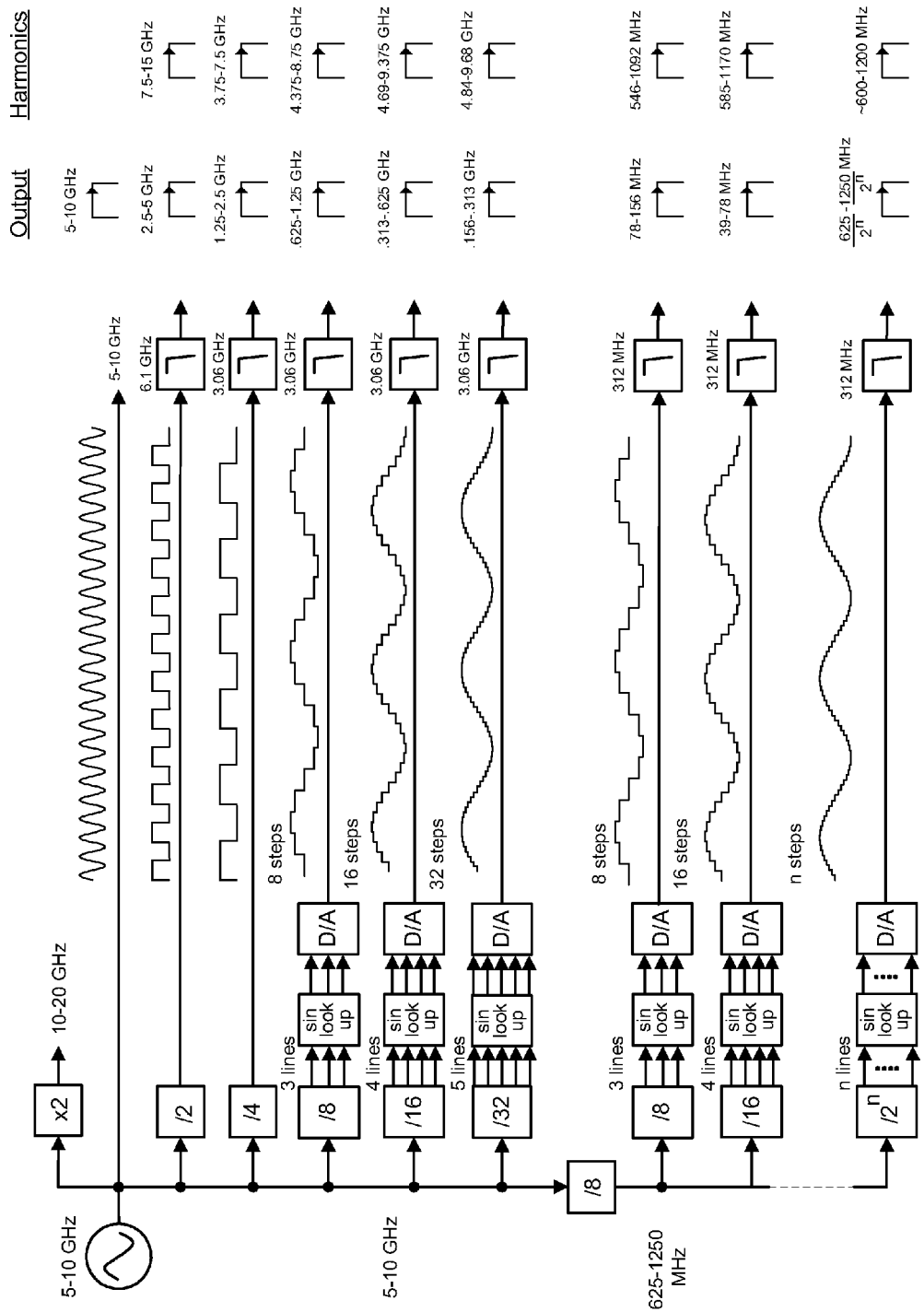
FIG. 4 is a block diagram of an embodiment of a system for generating low frequency sine waves in accordance with the present invention.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the drawing in which the reference number first appears.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein. The frequency bands used herein are for purposes of illustration and explanation and can vary between systems. Operating frequencies can vary greatly between broadband systems and instruments.

FIG. 1 illustrates a system for generating low frequency sine waves in accordance with the prior art. The system relies on downconverting a signal generated by a first high frequency oscillator using the signal from a second high frequency oscillator to generate low frequency sine waves. As shown, the first high frequency oscillator is capable of generating a signal having a frequency between 5 and 10 GHz, which generated signal is mixed with a signal from a second high frequency oscillator generating a signal having a frequency of 10 GHz. The downconverted frequency band extends from 70 kHz to 1.25 GHz. The bands between 1.25 GHz and 5 GHz are obtained by two stages of octave dividing, creating a band extending from 1.25 GHz to 2.5 GHz and a band extending from 2.5 GHz to 5 GHz. Each of the frequency bands is filtered to remove disruptive harmonics.

Phase noise is added in the mixing process of the two high frequency signals, resulting in higher phase noise levels for the low frequency band of 70 kHz to 1.25 GHz than for the upper level frequency bands ranging from 1.25 GHz to 10 GHz. Performance of the system of FIG. 1 has typically been acceptable for broadband instruments such as synthesizers and sweepers. However, applications have recently been developed requiring lower phase noise signals along with broadband performance. Phase noise levels for low frequency signals generated using the downconversion technique have been unacceptable in broadband instruments for such applications.

FIG. 2 illustrates another system for generating low phase noise, low frequency sine waves in accordance with the prior art. The system relies on many more stages of octave dividing. As shown, a high frequency oscillator is capable of generating signals having frequencies between 5 and 10 GHz, and seventeen stages of octave dividing are used to divide the generated signal by $2^{17}$ for a lowest frequency band extending from 38 kHz to 76 kHz. The seventeen stages of octave dividing allow the system to generate any frequency between 38 kHz and 10 GHz. Further, the phase noise in the generated signal is reduced by 6 decibels (dB) with each successive octave. The performance of the system is acceptable for broadband instruments. However, for each octave divide the first observable harmonic is the $3^{rd}$ harmonic of the output, requiring each of the frequency bands to be filtered based on the fundamental waveform and the $3^{rd}$ harmonic. Thus, each stage requires one or two low pass filters and a switch for switching between bands, taking up large amounts of circuit board space. Existing filters are bulky due to lumped element implementation at lower frequencies, resulting in a system and measurement instrument combination that is inconvenient to locate to a test site and limits a technician's mobility at the test site. The cost of the system can likewise go up with the inclusion of so many components.

FIG. 3 illustrates yet another system for generating low phase noise, low frequency sine waves in accordance with the prior art. The system relies on a signal source generating a fixed-frequency signal, for example a 1 GHz signal. The system relies on a numerically controlled oscillator (NCO) which uses a phase accumulator to create a synchronous (i.e. clocked), discrete-time, discrete-valued representation of a sine wave and a digital-to-analog converter to create arbitrary waveforms from the fixed-frequency signal. A low-pass filter removes an image generated by the NCO. NCOs can be used with frequencies as high as 8 GHz to generate relatively lower frequencies. NCOs can be used to generate clean, low frequency signals without the myriad filters and switching required of the previously described technique. However, NCOs require high powers and broadband NCOs can be costly, particularly when used at higher frequencies.

FIG. 4 is a block diagram of an embodiment of a system for generating low phase noise, low frequency sine waves in accordance with the present invention. As shown, the system comprises a variable signal source that generates a high frequency signal (also referred to herein as a primary signal), octave dividers to generate the first two octaves of the primary signal, and thereafter comprises a first series of octave dividing stages for generating sine waves within separate bands of frequencies. Each octave dividing stage includes a frequency divider that generates octaves of an input signal, a digital-to-sine (DTS) converter, and a low pass filter to reduce higher order harmonics in generated signals. The DTS converter comprises a sine look up table and a digital-to-analog converter (DAC). As shown, the first series of octave dividing stages generates the third, fourth and fifth octaves of the primary signal, although in other embodiments, the first series can include octave dividing stages to generate more or fewer octaves of the primary signal.

The system further comprises an input divider that divides the primary signal to generate a secondary signal that is input to a second series of octave dividing stages for generating lower bands of frequencies. As shown, the secondary signal is the third octave of the primary signal, but in other embodiments can be some other octave of the primary signal and can, where a broadband comprising contiguous narrow bands is desired for the system, depend on the octaves generated by the first series of stages. For example, if the first series of octave dividing stages generates only the third and fourth octaves, the secondary signal is the second octave of the primary signal. Each of the octave dividing stages of the second series includes a frequency divider, a DTS converter, and a low pass filter to reduce higher order harmonics in generated signals. As above, the DTS converter comprises a sine look up table and a DAC. As shown, the second series of octave dividing stages generates the third through nth octaves of the primary signal, wherein the nth octave is determined based on a targeted lower operating limit of the system. Logic gates can be very power hungry and expensive. Using an input divider to divide the primary signal before the signal enters the octave dividing stages of the second series permits the use of less expensive components with lower power requirements relative to components designed to operate at very high frequencies. The system also includes a frequency multiplier, extending the bandwidth of the system to 20 GHz.

In some embodiments, the system can further comprise a secondary input divider that divides the secondary signal to generate a tertiary signal that is input to a third series of octave dividing stages resembling the first and second series of octave dividing stages. In still other embodiments, the input signals to successive series of octave dividing stages can be further divided, as desired by a designer of the system. Systems in accordance with the present invention are not intended to be limited by any specific number of series of octave dividing stages, or limited by any specific number of octave dividing stages within a series.

Figure 5:
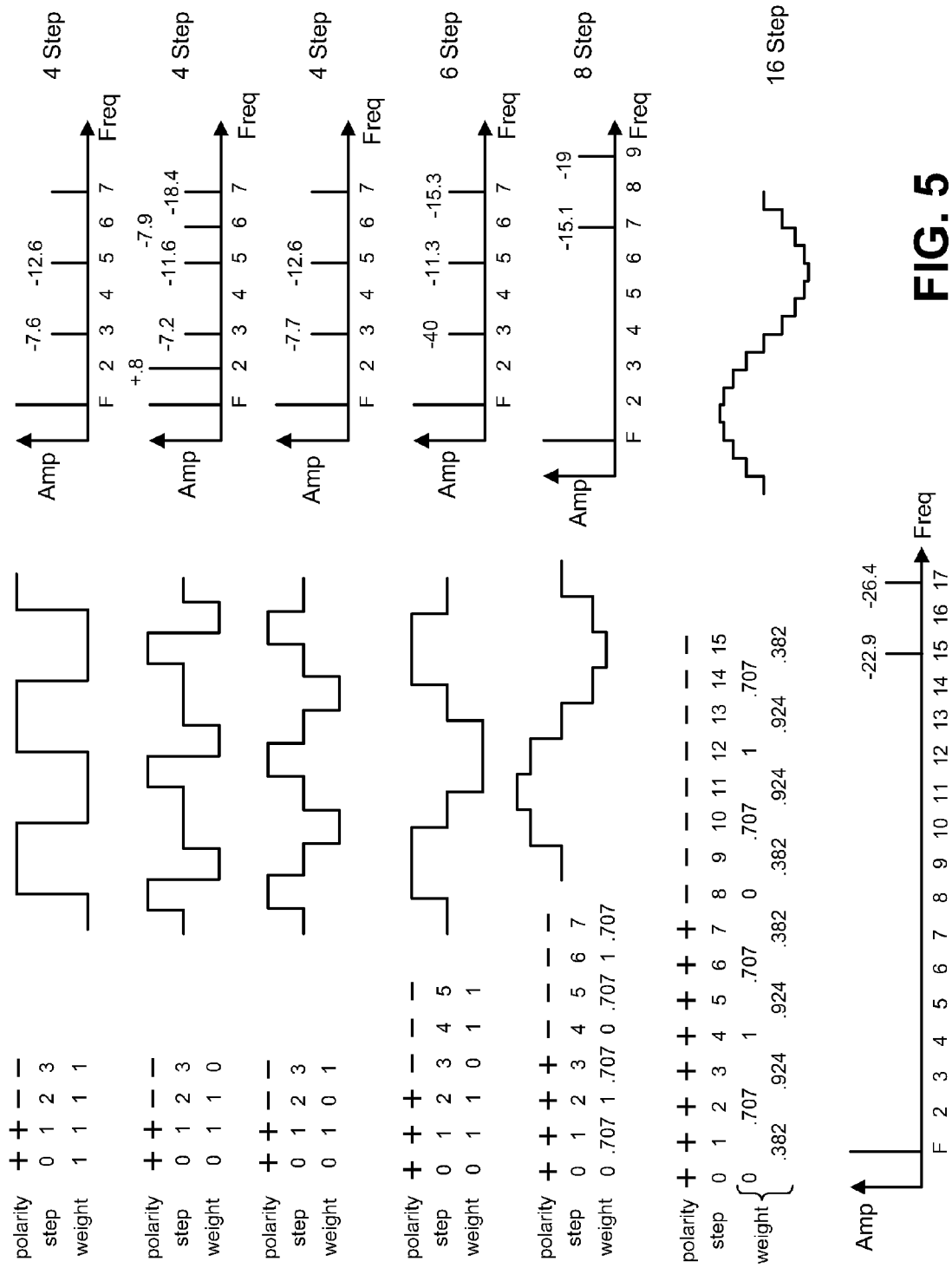
FIG. 5 illustrates various signals generated in a digital-to-sine converter and resulting harmonics.

Referring to FIG. 5, a set of waveforms and associated harmonic content generated by the octave dividing stages is shown using the signal divisions as steps in the waveform. As can be seen, for a six step waveform, the first major harmonic generated is the $5^{th}$ harmonic, which provides sufficiently useful separation from the fundamental waveform. However, six step waveforms are hard to implement at microwave frequencies. The first observable harmonic generated for an eight step waveform, which is comparatively easy to implement at microwave frequencies, is the $7^{th}$ harmonic, which has good separation from the fundamental waveform, simplifying the selection of a low pass filter to remove the harmonic content. It has been observed by the inventor that as the steps of the waveform increase, the first observable harmonic separates further from the fundamental waveform. The first observable harmonic for the sixteen step waveform is the $15^{th}$ harmonic. The first observable harmonic for the thirty-two step waveform is the $31^{st}$ harmonic. Referring again to FIG. 4, this permits the use of identical low pass filters for the octave dividing stages in the first series, and identical low pass filters for the octave dividing stages in the second series. The use of identical filters can simplify construction of the system and reduce costs.

Figure 6:
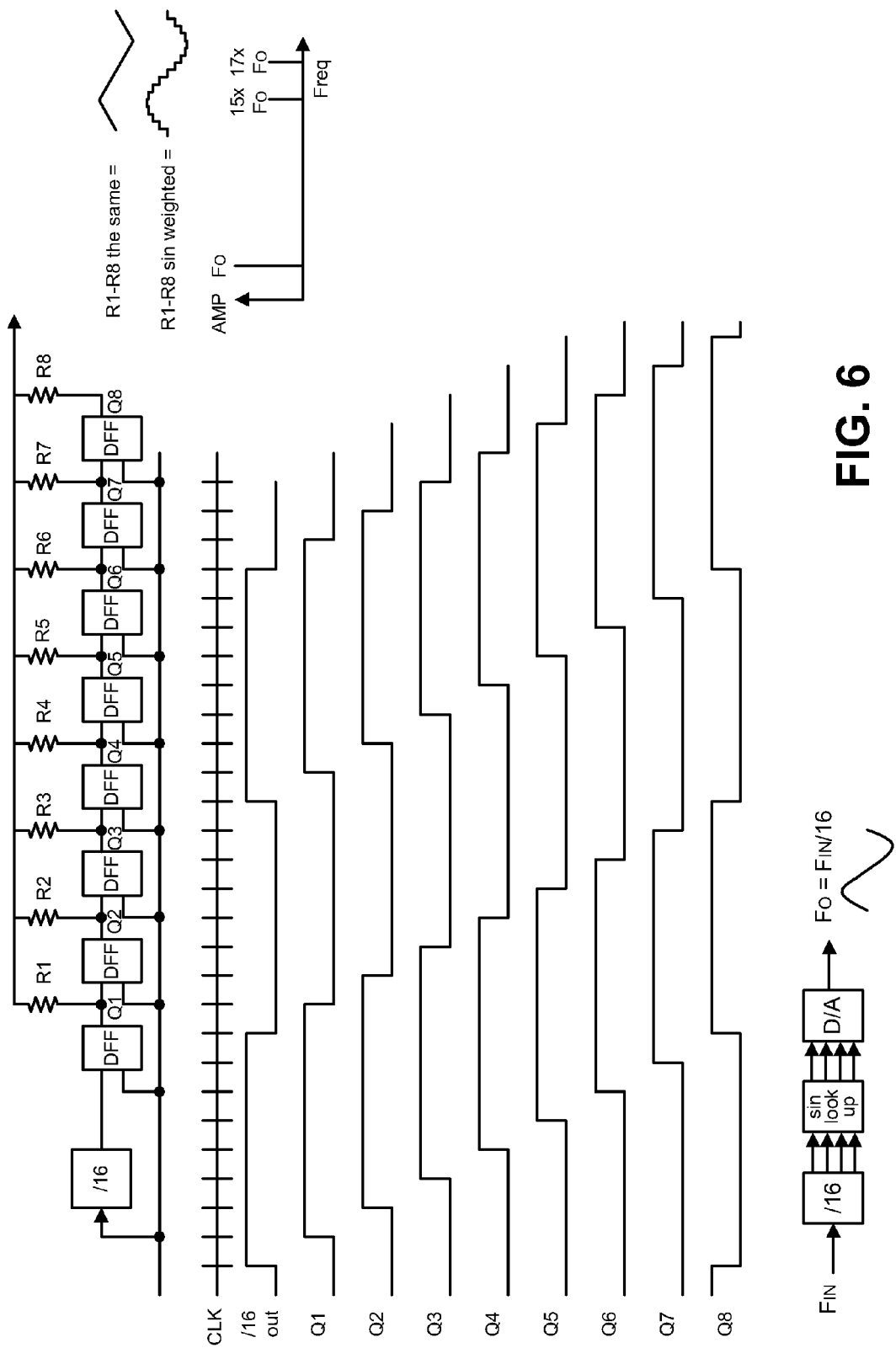
FIG. 6 is a block diagram of a digital-to-sine converter for use with embodiments of systems for generating low frequency sine waves in accordance with the present invention.

FIG. 6 is a block diagram of an embodiment of a digital-to-sine (DTS) converter in accordance with the present invention for use with embodiments of systems in accordance with the present invention. The DTS converter comprises the sine lookup table and DAC. The sine lookup table and DAC is comprised of a series of eight D Flip Flop (DFF) circuits including sine weighted resistors R1-R8 for generating the waveform for the sixteen step sine wave. As shown, there are eight DFF circuits and eight resistors for the sixteen step waveform. There are half as many DFF circuits and resistors as steps in a generated waveform such that for a thirty-two step waveform will use sixteen DFF circuits and sixteen resistors. It is possible for the DTS usable with thirty-two step waveforms to be used with lower step waveforms, such as sixteen and eight step waveforms by driving the input DFF with the appropriate control signal. The DTS converter is usable with the first series of octave dividing stages, while the second series of octave dividing stage (generating signals in bands up to 156 MHz) can use a traditional sine look up read-only memory (ROM) chip and DAC.

Figure 7:
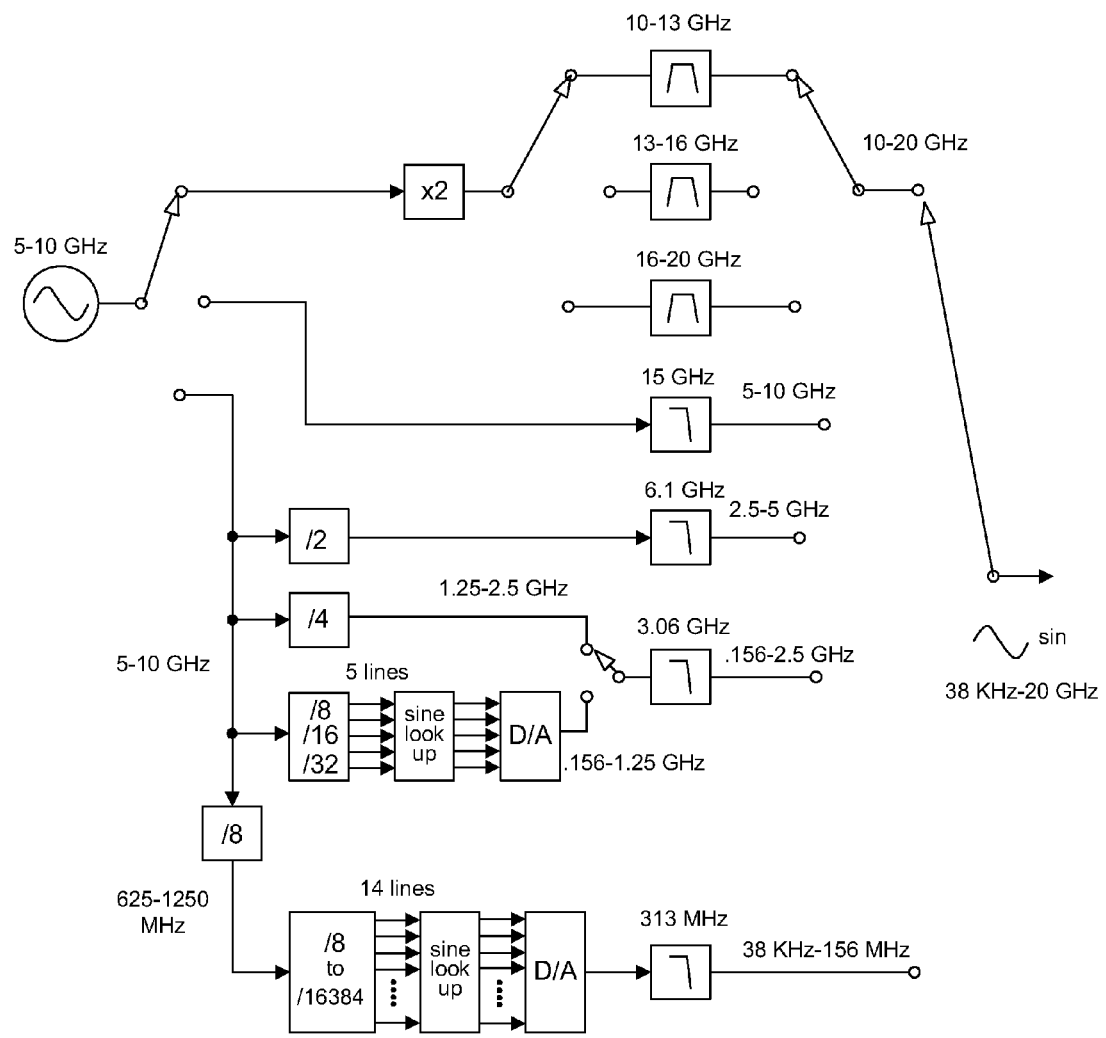
FIG. 7 is a block diagram of an alternative embodiment of a system for generating low frequency sine waves in accordance with the present invention.

FIG. 7 is a block diagram of another embodiment of a system for generating low frequency sine waves in accordance with the present invention. The embodiment takes advantage of the use of identical filters to aggregate the first series of octave dividing stages into a single selectable octave divider and a single DTS converter switched into a common filter with the second octave divider (/4), and to aggregate the second series of octave dividing stages into a single selectable octave divider and DTS converter with a single filter common to the octave divisions, for example. As shown, the system uses three low pass filters for signals generated with frequencies between 38 kHz and 5 GHz, while the prior art system of FIG. 2 uses seventeen low pass filters for signals generated with frequencies between 38 kHz and 5 GHz. The reduction in filters (and related switches) allows test instruments using the system to be dramatically reduced in size and cost, making such test instruments more versatile, portable, and cost efficient. As above, the system also includes a frequency multiplier, extending the bandwidth of the system to 20 GHz.

Figure 8:
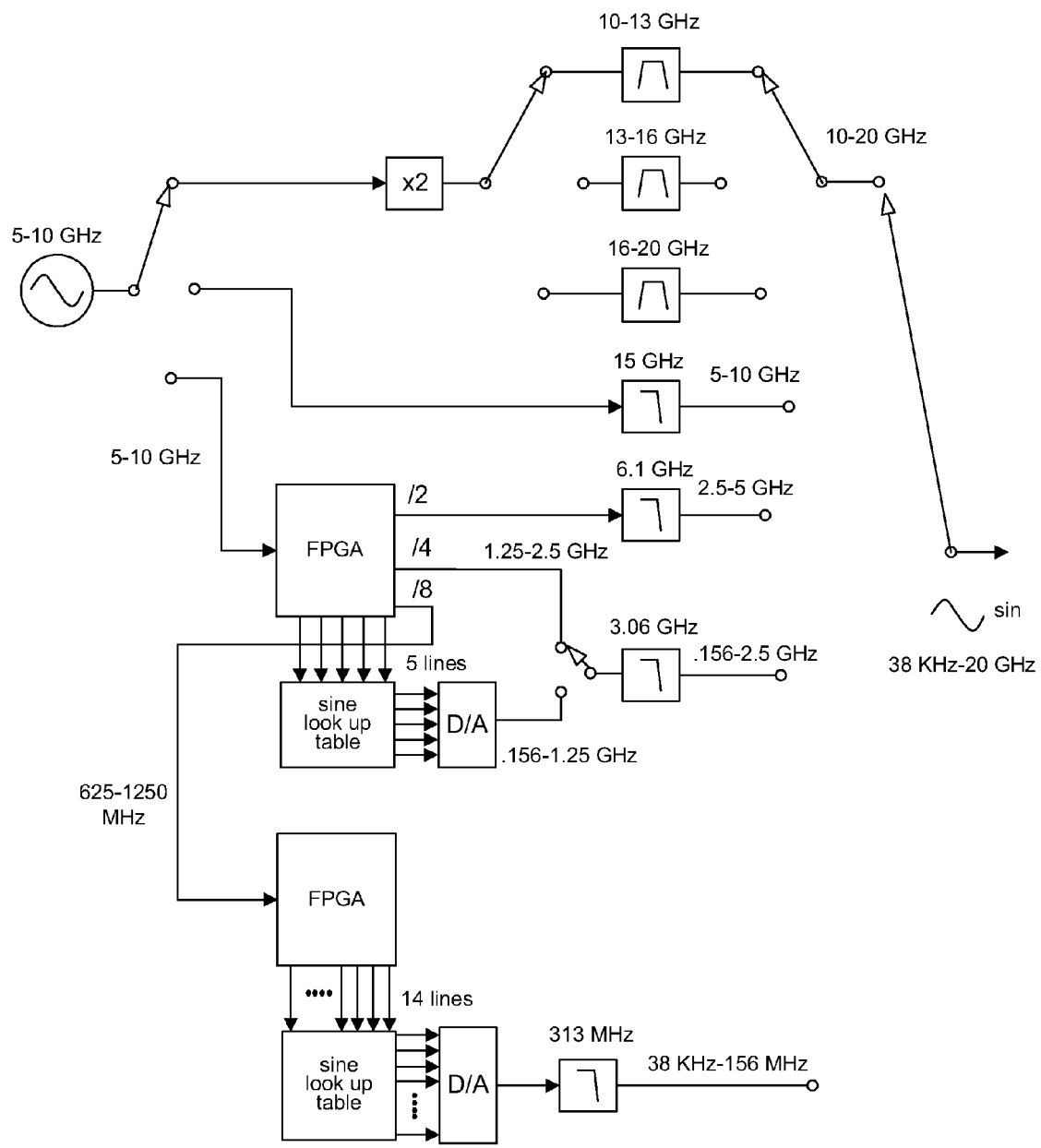
FIG. 8 is a block diagram of an alternative embodiment of a system for generating low frequency sine waves in accordance with the present invention.

FIG. 8 is a block diagram of another embodiment of a system for generating low frequency sine waves in accordance with the present invention. The system comprises a first field-programmable gate array (FPGA) to handle frequency dividing for the first two octaves divisions and the first series of octave dividing stages, and to output the secondary signal, which as shown is the third octave of the primary signal, to a second FPGA to handle the second series of octave dividing. Use of FPGAs can further reduce the cost of the system over the use of custom application specific integrated circuits (ASICs). As with the previous embodiment, the system uses three low pass filters for signals generated with frequencies between 38 kHz and 5 GHz. As above, the system also includes a frequency multiplier, extending the bandwidth of the system to 20 GHz, but switchably band pass filtering the generated signals in three different bands. The result is a low cost, low phase noise, compact, versatile system for generating signals with a frequency between 38 kHz and 20 GHz.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for generating a low phase noise, low frequency signal, comprising:
    a variable signal source for generating a primary signal;
    a first series of octave dividing stages connected with the variable signal source;
    wherein each octave dividing stage of the first series generates a successive octave of the primary signal using a frequency divider,
        a digital-to-sine (DTS) converter, and
        a low pass filter;
    an input divider connected with the variable signal source to generate a secondary signal that is an octave of the primary signal; and
    a second series of octave dividing stages connected with an output of the input divider;
    wherein each octave dividing stage of the second series generates a successive octave of the secondary signal using
        a frequency divider,
        a DTS converter, and
        a low pass filter.

2. The system of claim 1, further comprising:
    a first frequency divider for generating a first octave of the primary signal and a first low pass filter;
    a second frequency divider for generating a second octave of the primary signal and a second low pass filter; and
    wherein the first series of octave dividing stages generates third, fourth, and fifth octaves of the primary signal;
    wherein the second series of octave dividing stages generates third through nth octaves of the secondary signal;
    wherein the nth octave is determined based on a lowest operating frequency of the system.

3. The system of claim 1, wherein the octave dividing stages of the first series use a common low pass filter and the octave dividing stages of the second series use a common low pass filter.

4. The system of claim 1, wherein the octave dividing stages of the first series use a first common DTS converter comprising a sine look up table and a digital-to-analog converter, and the octave dividing stages of the second series use a second common DTS converter comprising a sine look up table and a digital-to-analog converter.

5. The system of claim 1, further comprising:
    a first field-programmable gate array (FPGA) providing the frequency divider for each of the octave dividing stages of the first series, the first FPGA having an input for receiving the primary signal;
    wherein the octave dividing stages of the first series use a first DTS converter and the second low pass filter;
    wherein the first FPGA further provides the input divider for generating the secondary signal; and
    a second FPGA providing the frequency divider for each of the octave dividing stages of the second series, the second FPGA having an input for receiving the secondary signal; and
    wherein the octave dividing stages of the second series use a second DTS converter and a third low pass filter.

6. The system of claim 1, wherein the DTS converter for each octave dividing stage from the first and second series comprises a plurality of D flip flop (DFF) circuits and sine weighted resistors.

7. A system for generating a low phase noise, low frequency signal, comprising:
    a variable signal source for generating a primary signal;
    a first frequency divider for generating a first octave of the primary signal and a first low pass filter;
    a second frequency divider for generating a second octave of the primary signal and a second low pass filter;
    a first series of octave dividing stages connected with the variable signal source;
    wherein each octave dividing stage of the first series generates a successive octave of the primary signal using a frequency divider, a digital-to-sine (DTS) converter, and a low pass filter;
    an input divider connected with the variable signal source to generate a secondary signal that is an octave of the primary signal;
    a second series of octave dividing stages connected with an output of the input divider;
    wherein each octave dividing stage of the second series generates a successive octave of the secondary signal using a frequency divider, a DTS converter, and a low pass filter.

8. The system of claim 7, wherein the octave dividing stages of the first series use the second low pass filter and the octave dividing stages of the second series use a third low pass filter.

9. The system of claim 7, wherein the octave dividing stages of the first series use a common DTS converter comprising a sine look up table and a digital-to-analog converter, and the octave dividing stages of the second series use a common DTS converter comprising a sine look up table and a digital-to-analog converter.

10. The system of claim 7,
wherein the first series of octave dividing stages generates third, fourth, and fifth octaves of the primary signal;
wherein the second series of octave dividing stages generates third through nth octaves of the secondary signal;
wherein the nth octave is determined based on a lowest operating frequency of the system.

11. The system of claim 7, further comprising:
a first field-programmable gate array (FPGA) providing the frequency divider for each of the octave dividing stages of the first series, the first FPGA having an input for receiving the primary signal;
wherein the octave dividing stages of the first series use a first DTS converter and the second low pass filter;
wherein the first FPGA further provides the input divider for generating the secondary signal; and
a second FPGA providing the frequency divider for each of the octave dividing stages of the second series, the second FPGA having an input for receiving the secondary signal; and
wherein the octave dividing stages of the second series use a second DTS converter and a third low pass filter.

12. The system of claim 7, wherein the DTS converter for the first series of octave dividing stages comprises a plurality of D flip flop (DFF) circuits and sine weighted resistors.

13. A system for generating a low phase noise, low frequency signal, comprising:
a variable signal source for generating a primary signal;
a first frequency divider for generating a first octave of the primary signal;
a second frequency divider for generating a second octave of the primary signal;
a first field-programmable gate array (FPGA) configured to divide the primary frequency into a first octave that is provided to a first low pass filter and a second octave that is provided to a second low pass filter;
wherein the first FPGA is further configured to divide the primary frequency into a series of octaves of the primary signal below the second octave that are each provided to a first digital-to-sin(DTS) converter and the second low pass filter;
wherein the first FPGA is further configured to generate a secondary signal that is an octave of the primary signal;
a second FPGA configured to divide the secondary signal into a series of octaves of the secondary signal that are each provided to a second DTS converter and a third low pass filter.

14. The system of claim 13,
wherein the first FGPA divides the primary signal into third, fourth, and fifth octaves of the primary signal;
wherein the second FGPA divides the secondary signal into third through nth octaves of the secondary signal;
wherein the nth octave is determined based on a lowest operating frequency of the system.

15. A system for generating a low phase noise, low frequency signal, comprising:
a variable signal source for generating a primary signal;
a first series of octave dividing stages connected with the variable signal source;
wherein each octave dividing stage of the first series generates a successive octave of the primary signal;
an input divider connected with the variable signal source to generate a secondary signal that is an octave of the primary signal; and
a second series of octave dividing stages connected with an output of the input divider;
wherein each octave dividing stage of the second series generates a successive octave of the secondary signal.

16. The system of claim 15, further comprising:
a first frequency divider for generating a first octave of the primary signal; and
a second frequency divider for generating a second octave of the primary signal;
wherein the first series of octave dividing stages generates third, fourth, and fifth octaves of the primary signal;
wherein the second series of octave dividing stages generates third through nth octaves of the secondary signal;
wherein the nth octave is determined based on a lowest operating frequency of the system.

17. The system of claim 15, wherein each octave dividing stage of the first and second series of octave dividing stages generates a successive octave of the primary signal using a frequency divider, a digital-to-sine (DTS) converter, and a low pass filter.

18. The system of claim 15, wherein the octave dividing stages of the first series use a first common DTS converter comprising a sine look up table and a digital-to-analog converter, and the octave dividing stages of the second series use a second common DTS converter comprising a sine look up table and a digital-to-analog converter.

* * * * *